US009377631B2

(12) United States Patent
Huang

(10) Patent No.: US 9,377,631 B2
(45) Date of Patent: Jun. 28, 2016

(54) 3D GRATING BOX AND THE MANUFACTURING METHOD THEREOF, COLOR FILTER SUBSTRATE AND DISPLAY DEVICE

(71) Applicants: BOE Technology Group Co., Ltd., Beijing (CN); Chengdu BOE Optoelectronics Technology Co., Ltd., Chengdu (CN)

(72) Inventor: Xiaomei Huang, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 0 days.

(21) Appl. No.: 14/314,745

(22) Filed: Jun. 25, 2014

(65) Prior Publication Data
US 2015/0260998 A1 Sep. 17, 2015

(30) Foreign Application Priority Data

Mar. 12, 2014 (CN) .......................... 2014 1 0090960

(51) Int. Cl.
G02B 27/22 (2006.01)
G02B 5/20 (2006.01)

(52) U.S. Cl.
CPC ............ *G02B 27/2214* (2013.01); *G02B 5/201* (2013.01)

(58) Field of Classification Search
CPC ............... G02B 27/2214; G02B 27/22; G02B 27/2228; G02B 27/2207; Y02E 10/544; Y02E 10/10541; Y02E 10/52

USPC .......... 359/462, 469, 472, 466, 467; 136/252, 136/256
See application file for complete search history.

(56) References Cited

U.S. PATENT DOCUMENTS

| 3,600,588 | A | 8/1971 | Sayce | |
|---|---|---|---|---|
| 2009/0126790 | A1* | 5/2009 | Nishi | H01L 31/1133 136/257 |
| 2010/0186816 | A1* | 7/2010 | Park | H01L 31/022425 136/256 |
| 2011/0079274 | A1* | 4/2011 | Kang | H01G 9/2068 136/252 |
| 2012/0170115 | A1* | 7/2012 | Zhang | G02B 27/26 359/465 |

* cited by examiner

*Primary Examiner* — Darryl J Collins
*Assistant Examiner* — Journey Sumlar
(74) *Attorney, Agent, or Firm* — Westman, Champlin & Koehler, P.A.

(57) ABSTRACT

A 3D grating box, a color filter substrate and a display device are disclosed. The 3D grating box comprises: a photoelectric conversion device for converting optical energy into electric energy; a transparent electrode electronically connected to a first side of the photoelectric conversion device; a grating electrode electronically connected to a second side of the photoelectric conversion device opposite to the first side, the grating electrode comprises a plurality of opaque strip conductors that are arranged side by side at intervals; a storage battery having a first end electronically connected to the transparent electrode and a second end electronically connected to the grating electrode; and a substrate, the grating electrode being arranged on one side of the substrate. The 3D grating box combines the 3D display with the solar cell effectively, simplifying the manufacturing process.

7 Claims, 3 Drawing Sheets

3D GRATING BOX AND THE MANUFACTURING METHOD THEREOF, COLOR FILTER SUBSTRATE AND DISPLAY DEVICE

CROSS-REFERENCE TO RELATED APPLICATION

This application claims the benefit of Chinese Patent Application No. 201410090960.1 filed on Mar. 12, 2014 in the State Intellectual Property Office of China, the whole disclosure of which is incorporated herein by reference.

BACKGROUND OF THE INVENTION

1. Field of the Invention

Embodiments of present invention relate to the field of 3D display technology, and in particular, to a 3D grating box and the manufacturing method thereof, and a color filter substrate comprising this 3D grating box and a display device.

2. Description of the Related Art

The display device comprising a 3D grating box based on the parallax barrier technology to realize the 3D display effect, and the principal thereof is that: the 3D grating box is provided in front of the display screen, the left eye and the right eye of a user can see respectively the pictures with parallax because of the shield of the strip grating in the 3D grating box, and thus the 3D display effect is realized.

A solar cell can convert the optical energy into the electrical energy that may be stored and used. The solar cell mainly comprises a photoelectric conversion device and electrodes provided on both ends of the photoelectric conversion device. The two electrodes are connected respectively to both ends of a storage battery to store the converted electrical energy.

In the display device that comprises a solar cell, the solar cell is provided within the display panel. The manufacturing process is very complex.

SUMMARY OF THE INVENTION

The present invention provides a 3D grating box and the manufacturing method thereof, a color filter substrate and a display device, which combine the 3D display with the solar cell effectively and simplify the manufacturing process.

According to the embodiment of one aspect of the present invention, there is provided a 3D grating box comprising: a photoelectric conversion device for converting optical energy into electric energy; a transparent electrode electronically connected to a first side of the photoelectric conversion device; a grating electrode electronically connected to a second side of the photoelectric conversion device opposite to the first side, the grating electrode comprising a plurality of opaque strip conductors that are arranged side by side at intervals; a storage battery having a first end electronically connected to the transparent electrode and a second end electronically connected to the grating electrode; and a substrate, the grating electrode being arranged on one side of the substrate.

According to the embodiment of another aspect of the present invention, there is provided a color filter substrate comprising a 3D grating box and a color filter. The 3D grating box comprising: a photoelectric conversion device for converting optical energy into electric energy; a transparent electrode electronically connected to a first side of the photoelectric conversion device; a grating electrode electronically connected to a second side of the photoelectric conversion device opposite to the first side, the grating electrode comprising a plurality of opaque strip conductors that are arranged side by side at intervals; a storage battery having a first end electronically connected to the transparent electrode and a second end electronically connected to the grating electrode; and a substrate, the grating electrode being arranged on one side of the substrate. The color filter is arranged on the other side of the substrate in the 3D grating box opposite to the grating electrode.

According to the embodiment of a further aspect of the present invention, there is provided a display device comprising the color filter substrate according to the above embodiments.

BRIEF DESCRIPTION OF THE DRAWINGS

To more clearly illustrate the technical solutions of the prior art or the embodiments of the present invention, figures needed in the description of the prior art or the embodiments are simply depicted. Apparently, figures in the below description are only some of exemplary embodiments of the present invention. For those skilled in the art, other figures can be obtained according to these figures without exercising creative efforts.

DETAILED DESCRIPTION OF PREFERRED EMBODIMENTS OF THE INVENTION

The technical solutions in the embodiments of the present invention will be described clearly and completely hereinafter with reference to the attached drawings in the embodiments of the present invention. Apparently, the described embodiments are only part of the exemplary embodiments of the present invention and are not tended to covering all of the embodiments. Based on the exemplary embodiments in the present invention, all the other embodiments made by those skilled in the art without exercising creative efforts fall into the protection scope of the present invention.

In addition, in the following detailed description, for the purposes of convenient explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
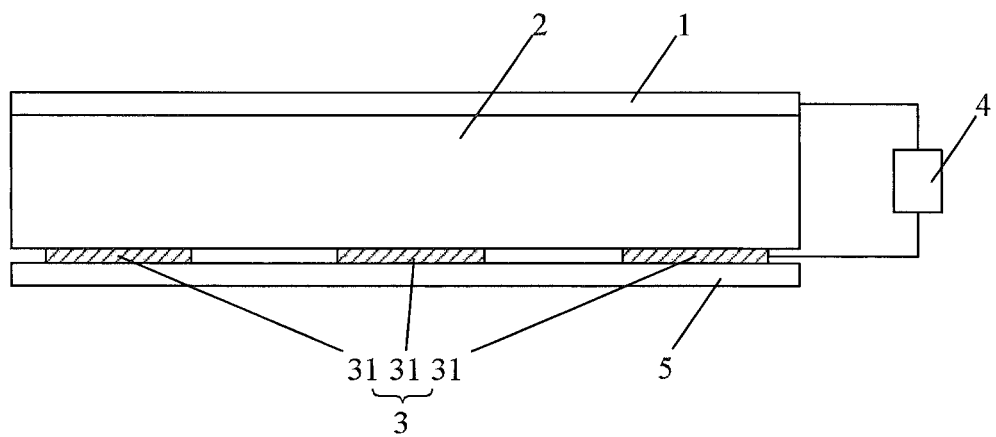
FIG. 1 is a structure schematic view of a 3D grating box according to an exemplary embodiment of the present invention.

As shown in FIG. 1, according to an exemplary embodiment of the present invention, there is provided a 3D grating box comprising: a photoelectric conversion device 2 for converting the optical energy into the electric energy; a transparent electrode 1 electronically connected to a first side of the photoelectric conversion device 2 (i.e. the upper side of the photoelectric element 2 in FIG. 1); a grating electrode 3 electronically connected to a second side of the photoelectric conversion device 2 opposite to the first side (i.e. the lower side of the photoelectric element 2 in FIG. 1), the grating electrode 3 comprising a plurality of opaque strip conductors 31 that are arranged side by side at intervals; a storage cell 4 having a first end electronically connected to the transparent electrode 1 and a second end electronically connected to the grating electrode 3; and a substrate 5, the grating electrode 3 being arranged on one side of the substrate 5.

In particular, on one hand, the transparent electrode 1, the photoelectric conversion device 2, the grating electrode 3 and the storage battery 4 constitute a solar cell, wherein the transparent electrode 1 and the grating electrode 3 are served respectively as the two electrodes of the photoelectric conversion device. When sunlight radiates onto the photoelectric conversion device 2, the photoelectric conversion device 2 generates the current which is transferred through the transparent electrode 1 and the grating electrode 3 into the storage battery 4 to be stored and used; on the other hand, the transparent electrode 1 and the photoelectric conversion device 2 are light transparent, and the grating electrode 3 comprises a plurality of opaque strip conductors 31 that are arranged side by side at intervals. Therefore, the grating electrode 3 also has a function of shielding line of sight, and thus the function of the 3D grating box is realized.

The 3D grating box of the present embodiment combines effectively the solar cell and the 3D display assembly. Therefore, the 3D grating box can function as the solar photovoltaic cell. Furthermore, the grating electrode is acted as the electrode of the photoelectric conversion device and the grating in the 3D grating box, which simplifies the manufacturing process.

Figure 2:
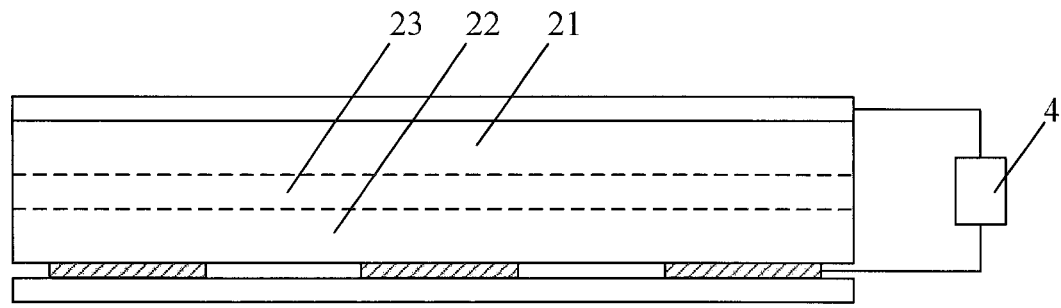
FIG. 2 is a structure schematic view of a photoelectric conversion device according to an exemplary embodiment of the present invention.

In a further exemplary embodiment, as shown in FIG. 2, the above photoelectric conversion device 2 comprises a semiconductor device. An upper part of this semiconductor device is a P type semiconductor 21, and a lower part of this semiconductor device is a N type semiconductor 22. A PN junction 23 is formed between the P type semiconductor 21 electronically connected to the transparent electrode 1 and the N type semiconductor 22 electronically connected to the grating electrode 3. In an alternative embodiment, the foregoing photoelectric conversion device 2 may comprises a plurality of semiconductor devices connected in series. That is, the plurality of semiconductor devices are arranged sequentially from top to bottom, and each of the semiconductor devices comprises the N type semiconductor locating in the upper part, the P type semiconductor locating in the lower part and the PN junction formed between the N type semiconductor and the P type semiconductor.

In an exemplary embodiment, the foregoing transparent electrode 1 may be made of Indium Tin Oxide (ITO).

The 3D grating box according to the embodiment of the present invention combines effectively the solar cell and the 3D display assembly. The 3D grating box may function as the solar photovoltaic cell. The grating electrode functions as the electrode of the photoelectric conversion device and the grating in the 3D grating box, which simplifies the manufacturing process.

Figure 3:
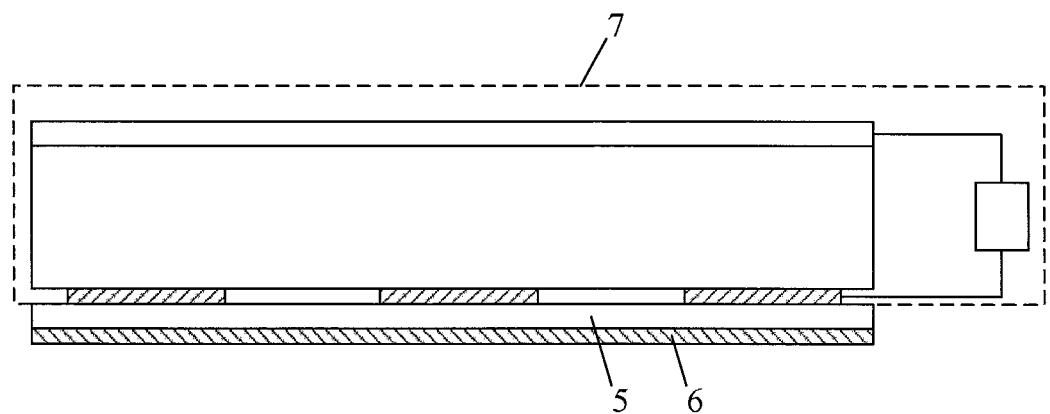
FIG. 3 is a structure schematic view of a color filter substrate according to an exemplary embodiment of the present invention.

As shown in FIG. 3, according to the embodiment of another aspect of the present invention, there is provided a color filter substrate comprising: the 3D grating box 7 according to the foregoing various embodiments and a color filter 6, wherein the color filter 6 is arranged on a side of the substrate 5 in the 3D grating box 7 opposite to the grating electrode (i.e. the lower side of the substrate 5 in FIG. 3). The principal and the specific structure of the 3D grating box 7 have been elaborated in the foregoing embodiments and will not be repeated herein.

The color filter according to the embodiment of the present invention combines effectively the solar cell and the 3D display assembly. The 3D grating box may function as the solar photovoltaic cell. The grating electrode functions as the electrode of the photoelectric conversion device and the grating in the 3D grating box, which simplifies the manufacturing process.

According to the embodiment of a further aspect of the present invention, there is provided a display device comprising the color filter substrate according to the foregoing embodiments. The principal and the specific structure of this color filter substrate have been elaborated in the foregoing embodiments and will not be repeated herein.

The display device according to the embodiment of the present invention combine effectively the solar cell and the 3D display assembly. The 3D grating box may function as the solar photovoltaic cell. The grating electrode functions as the electrode of the photoelectric conversion device and the grating in the 3D grating box, which simplifies the manufacturing process.

Figure 4:
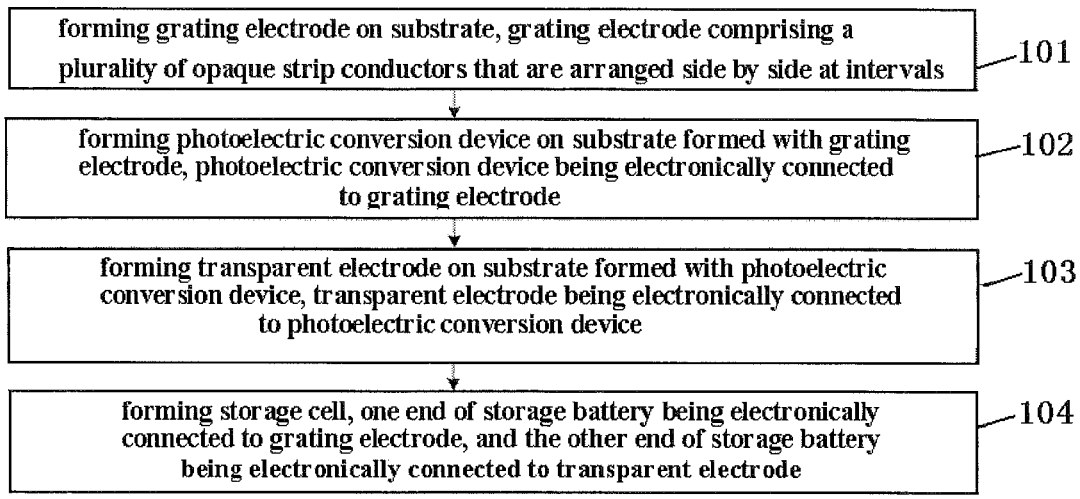
FIG. 4 is a flow chart of a method of manufacturing a 3D grating box according to an exemplary embodiment of the present invention.
Figure 5:
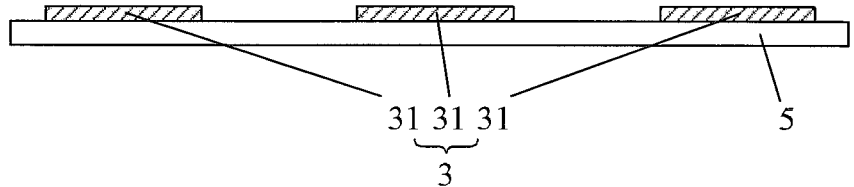
FIG. 5 is a structure schematic view of the 3D grating box after grating electrodes are formed during performing the manufacturing method as shown in FIG. 4.
Figure 6:
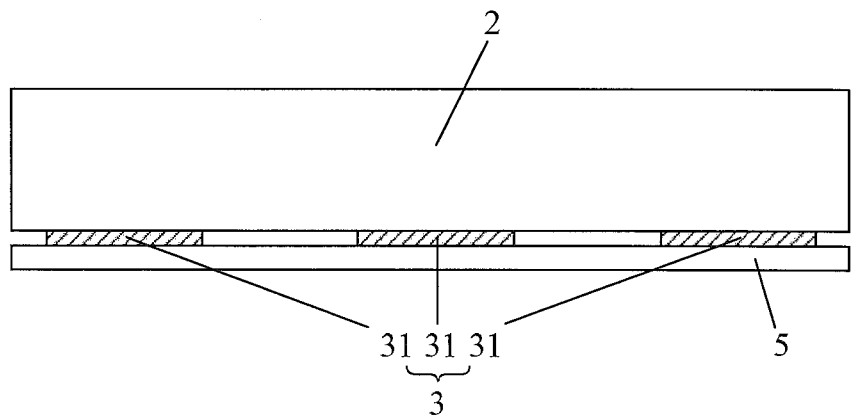
FIG. 6 is a structure schematic view of the 3D grating box after a photoelectric conversion device is formed during performing the manufacturing method as shown in FIG. 4.
Figure 7:
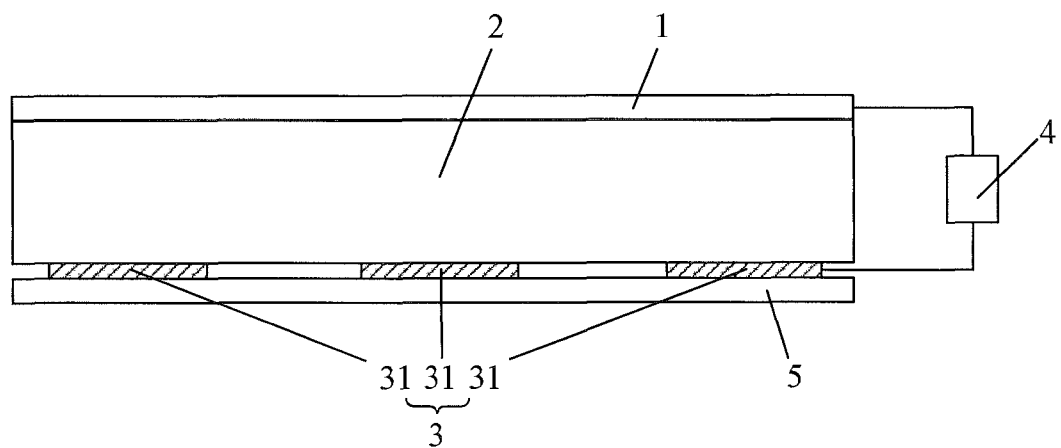
FIG. 7 is a structure schematic view of the 3D grating box after light transparent electrodes and a storage battery are formed during performing the manufacturing method as shown in FIG. 4.

FIG. 4 is a flow chart of a method of manufacturing a 3D grating box according to an exemplary embodiment of the present invention. Furthermore, as shown FIGS. 5-7, the method of manufacturing the 3D grating box according to an exemplary embodiment of the present invention comprises steps of:

as shown in FIG. 5, in step 101, forming an grating electrode 3 on a substrate 5, the grating electrode 3 comprising a plurality of opaque strip conductors 31 that are arranged side by side at intervals;

as shown in FIG. 6, in step 102, forming a photoelectric conversion device 2 on the substrate formed with the grating electrode 3, the photoelectric conversion device being electronically connected to the grating electrode 3;

as shown in FIG. 7, in step 103, forming a transparent electrode 1 on the substrate formed with the photoelectric conversion device 2, the transparent electrode being electronically connected to the photoelectric conversion device 2; and in step 104, forming a storage cell 4, one end of the storage cell 4 being electronically connected to the grating electrode 3, and the other end of the storage cell 4 being electronically connected to the transparent electrode 1.

Please be noted that there is no requirement on the sequences between the step 104 and the other steps, as long as one end of the storage cell 4 is electronically connected to the grating electrode 3 and the other end of the storage cell 4 is electronically connected to the transparent electrode 1 after the above four steps are finished. For example, the storage cell 4 may be formed before step 101, and in the specific process of performing step 101 and step 103, both sides of the storage cell 4 is electronically connected to the transparent electrode 1 and the grating electrode 3 respectively.

Specifically, in step 102 of forming photoelectric conversion device 2 on the substrate formed with the grating electrode 3, a semiconductor device is formed and doped, so that the upper part of the semiconductor device is formed as a P type semiconductor, the lower part of the semiconductor device is formed as a N type semiconductor, and a PN junction is formed between the N type semiconductor and the P type semiconductor. The P type semiconductor is electronically connected to the transparent electrode 1, and the N type semiconductor is electronically connected to the grating electrode 3.

After forming the 3D grating box, a color filter is formed on the other side of the substrate 5 opposite to the grating electrode 3 (i.e. the lower side of the substrate 5 in FIG. 3) to form a color filter substrate.

The principal and the specific structure of the 3D grating box of the color filter substrate have been elaborated in the foregoing embodiments and will not be repeated herein.

By implementing the manufacturing method of the 3D grating according to the embodiment of the present aspect, the solar cell and the 3D display assembly may be combined together effectively. The resultant 3D grating box may function as the solar cell. The grating electrode is served as the electrode of the photoelectric conversion device and the grating in the 3D grating box, which simplifies the manufacturing process.

The foregoing is only preferred embodiments of the present invention, but the protection scope of the present invention is not limited thereto. It would be appreciated by those skilled in the art that under the disclosure scope of the present invention, various changes or modifications may be made and be contained in the protection scope of the present invention. Therefore, the protection scope of the present invention is defined in the claims.

What is claimed is:

1. A 3D grating box, comprising:
   a photoelectric conversion device configured to convert optical energy into electric energy;
   a transparent electrode electronically connected to a first side of the photoelectric conversion device;
   a grating electrode electronically connected to a second side of the photoelectric conversion device opposite to the first side, the grating electrode comprises a plurality of opaque strip conductors that are arranged side by side at intervals to shield line of sight, so that the left eye and the right eye of a user see the pictures with parallax, respectively;
   a storage battery comprising a first end electronically connected to the transparent electrode and a second end electronically connected to the grating electrode, the electric energy generated by the photoelectric conversion device being transferred to the storage battery through the transparent electrode and the granting electrode to be stored into the storage battery; and
   a substrate, the grating electrode is arranged on one side of the substrate.

2. The 3D grating box according to claim 1,
   wherein the photoelectric conversion device comprises a semiconductor device, an upper part of the semiconductor device comprises a P type semiconductor, and a lower part of the semiconductor device comprises a N type semiconductor, a PN junction is formed between the P type semiconductor and the N type semiconductor, the P type semiconductor is electronically connected to the transparent electrode, and the N type semiconductor is electronically connected to the grating electrode.

3. The 3D grating box according to claim 1,
   wherein the transparent electrode comprises indium tin oxide.

4. A color filter substrate, comprising:
   a 3D grating box, comprising:
     a photoelectric conversion device configured to convert optical energy into electric energy;
     a transparent electrode electronically connected to a first side of the photoelectric conversion device;
     a grating electrode electronically connected to a second side of the photoelectric conversion device opposite to the first side, the grating electrode comprises a plurality of opaque strip conductors that are arranged side by side at intervals to shield line of sight, so that the left eye and the right eye of a user see the pictures with parallax, respectively;
     a storage battery having a first end electronically connected to the transparent electrode and a second end electronically connected to the grating electrode, the electric energy generated by the photoelectric conversion device being transferred to the storage battery through the transparent electrode and the grating electrode to be stored into the storage battery; and
     a substrate, the grating electrode is arranged on one side of the substrate; and
   a color filter arranged on the other side of the substrate in the 3D grating box opposite to the grating electrode.

5. The color filter substrate according to claim 4,
   wherein the photoelectric conversion device comprises a semiconductor device, an upper part of the semiconductor device comprises a P type semiconductor, and a lower part of the semiconductor device comprises a N type semiconductor, a PN junction is formed between the P type semiconductor and the N type semiconductor, the P type semiconductor is electronically connected to the transparent electrode, and the N type semiconductor is electronically connected to the grating electrode.

6. The color filter substrate according to claim 4,
   wherein the transparent electrode comprises indium tin oxide.

7. A display device, comprising the color filter substrate according to claim 4.

* * * * *